US012808792B2

(12) United States Patent
Terumoto

(10) Patent No.: US 12,808,792 B2
(45) Date of Patent: Nov. 24, 2026

(54) DRIVING DEVICE AND TRANSMITTING/RECEIVING DEVICE

(71) Applicant: ROHM CO., LTD., Kyoto (JP)

(72) Inventor: Koji Terumoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 102 days.

(21) Appl. No.: 19/041,257

(22) Filed: Jan. 30, 2025

(65) Prior Publication Data

US 2025/0251342 A1 Aug. 7, 2025

(30) Foreign Application Priority Data

Feb. 1, 2024 (JP) ................................ 2024-014356

(51) Int. Cl.
*G01N 21/3581* (2014.01)
*G01B 11/24* (2006.01)
*H03K 3/353* (2006.01)

(52) U.S. Cl.
CPC ......... *G01N 21/3581* (2013.01); *G01B 11/24* (2013.01); *H03K 3/353* (2013.01)

(58) Field of Classification Search
CPC .................................................. G01N 21/3581
See application file for complete search history.

(56) References Cited

U.S. PATENT DOCUMENTS 4,571,506 A * 2/1986 Lisco .................. H04B 10/564 327/109
11,770,102 B2 * 9/2023 Kandori ................ H03B 5/129 331/96

FOREIGN PATENT DOCUMENTS

JP 2020115500 A 7/2020

* cited by examiner

*Primary Examiner* — Casey Bryant
(74) *Attorney, Agent, or Firm* — Fish & Richardson P.C.

(57) ABSTRACT

A driving device includes a current source configured to generate an output current. The current source is configured to periodically perform operations comprising of: increasing a current value of the output current, from a first current value in a non-transmitting region in which a transmitting element does not perform transmission, to a second current value larger than a transmittable region in which the transmitting element is capable of performing transmission, within one nanosecond; driving the transmitting element with the output current of the second current value; decreasing the current value of the output current from the second current value to a third current value in the transmittable region; driving the transmitting element with the output current of the third current value; and decreasing the current value of the output current from the third current value to the first current value.

11 Claims, 4 Drawing Sheets

DRIVING DEVICE AND TRANSMITTING/RECEIVING DEVICE

CROSS-REFERENCE TO RELATED APPLICATIONS

This nonprovisional application claims priority under 35 U.S.C. § 119(a) on Patent Application No. 2024-014356 filed in Japan on Feb. 1, 2024, the entire contents of which are hereby incorporated by reference.

BACKGROUND OF THE INVENTION

1. Technical Field

The present disclosure relates to a driving device and a transmitting/receiving device.

2. Description of Related Art

Conventionally, as illustrated in JP-A-2020-115500, for example, attempts are being made to perform high capacity communication, data processing, imaging, measurement, or the like, by using an electromagnetic wave in a frequency domain called a terahertz band having frequencies of 0.1 THz to 10 THz. This frequency domain has characteristics of light and radio wave. If a device working in this frequency band is realized, it can be used in many applications such as measurement in various fields such as physical properties, astronomy, and biology, in addition to the above-mentioned imaging, high capacity communication, and data processing.

DETAILED DESCRIPTION OF THE PREFERRED EMBODIMENTS

Transmitting/Receiving Device

Figure 1:
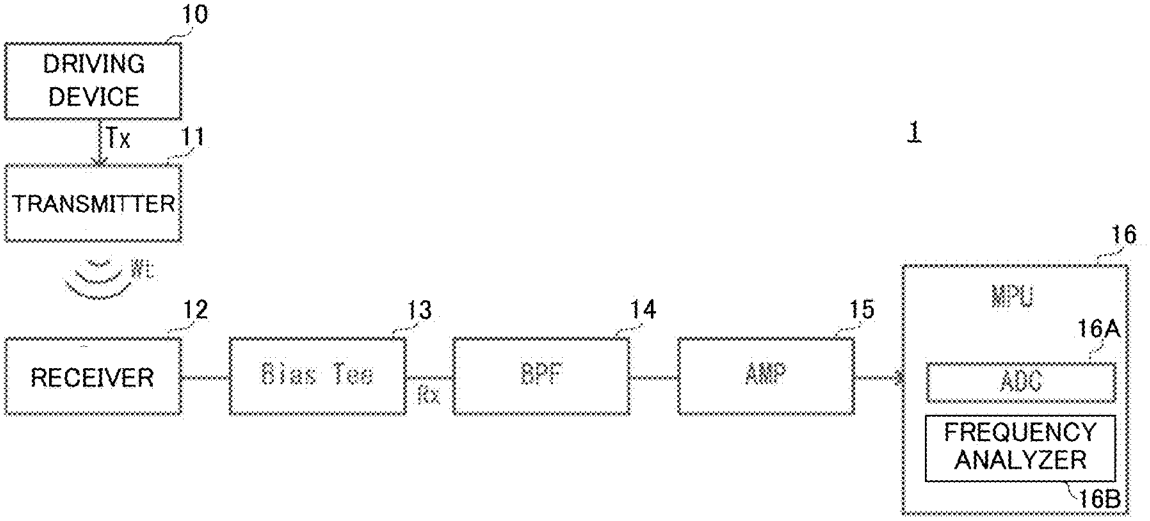
FIG. 1 is a diagram illustrating a structure of a transmitting/receiving device.

FIG. 1 is a diagram illustrating a structure of a transmitting/receiving device 1. The transmitting/receiving device 1 illustrated in FIG. 1 includes a driving device 10 and a transmitter 11 on a transmitting side, and it includes a receiver 12, a bias tee circuit 13, a band pass filter (BPF) 14, an amplifier 15, and a microprocessor (MPU) 16 on a receiving side. Note that, for example, the transmitting/receiving device 1 may have a structure of a reflection type, in which a transmission signal Wt output from the transmitter 11 is reflected by an object and is received by the receiver 12, or it may have a structure of a transmission type, in which the transmission signal Wt output from the transmitter 11 passes through the object and is received by the receiver 12. The object is typically a solid. However, without limiting to a solid, the object may be a liquid or a gas.

The driving device 10 supplies a modulated signal Tx to a terahertz device included in the transmitter 11, so as to drive the terahertz device included in the transmitter 11. The terahertz device included in the transmitter 11 transmits a terahertz wave that is an electromagnetic wave in a terahertz band. The terahertz device included in the transmitter 11 is typically a resonant tunnel diode (RTD). Note that the terahertz device included in the transmitter 11 is not limited to an RTD but may be a tunnel injection transit time (TUNNETT) diode, an impact ionization avalanche transit time (IMPATT) diode, a GaAs type field effect transistor (FET), a GaN type FET, a high electron mobility transistor (HEMT), or a heterojunction bipolar transistor (HBT), for example.

The transmitter 11 is a packaged chip in which a terahertz device and a micro slot antenna are formed on a substrate. When the terahertz device included in the transmitter 11 transmits a terahertz wave, the transmitter 11 outputs a transmission signal (transmission wave) Wt in a terahertz band.

The receiver 12 is a packaged chip in which a terahertz device and a micro slot antenna are formed on a substrate, similarly to the transmitter 11. The terahertz device included in the receiver 12 receives a terahertz wave. Note that the terahertz device included in the receiver 12 is also not limited to an RTD, similarly to the terahertz device included in the transmitter 11. The transmission signal Wt is received by the micro slot antenna included in the receiver 12.

Figure 2:
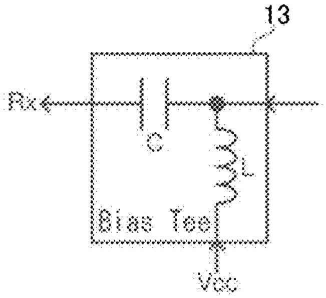
FIG. 2 is a diagram illustrating a structure of a bias tee circuit.

The bias tee circuit 13 is disposed between the receiver 12 and the BPF 14. As illustrated in FIG. 2, the bias tee circuit 13 includes an inductor L and a capacitor C. A DC voltage Vcc is supplied to the terahertz device included in the receiver 12 via the inductor L. An AC signal output from the receiver 12 passes through the capacitor C and is output to the BPF 14 as a received signal Rx. The capacitor C cuts the DC voltage Vcc.

The BPF 14 is a filter that passes a signal in a specific frequency band, so as to remove noise that can be contained in the received signal Rx. The specific frequency band described above is set to contain a frequency of the modulated signal Tx.

The amplifier 15 amplifies the signal after passing through the BPF 14 and outputs the same to the MPU 16. The MPU 16 includes an AD converter (ADC) 16A that performs an analog-to-digital conversion of the output from the amplifier 15, and a frequency analyzer 16B that performs a frequency analysis such as a fast Fourier transform (FFT) on the signal after the AD conversion. A power spectrum value at the frequency of the modulated signal Tx obtained by the frequency analyzer 16B is dealt as a signal intensity on the receiving side (which is, for example, a sensor sensitivity if the transmitting/receiving device 1 is a sensing device that detects a specific substance, or an imaging sensitivity if the transmitting/receiving device 1 is an imaging device that measures a shape of an object consisting of a specific material).

The driving device 10 described above drives the terahertz device with a current drive method (i.e., a drive method of controlling a drive current that is a value of the output current output from the driving device 10). In the terahertz device, a change in output of the terahertz device with respect to a change in the drive current supplied to the terahertz device is smaller than a change in output of the terahertz device with respect to a change in a drive voltage applied to the terahertz device.

Therefore, the driving device 10 adopting the current drive method can enhance output stability of the terahertz device with respect to a change in surrounding environment, compared with a driving device adopting a voltage drive method. In addition, the driving device 10 adopting the current drive method can enhance output stability of the terahertz device with respect to a power supply error (i.e., an output error of the driving device 10 or an output error of the driving device adopting the voltage drive method), compared with a driving device adopting the voltage drive method.

Figure 3:
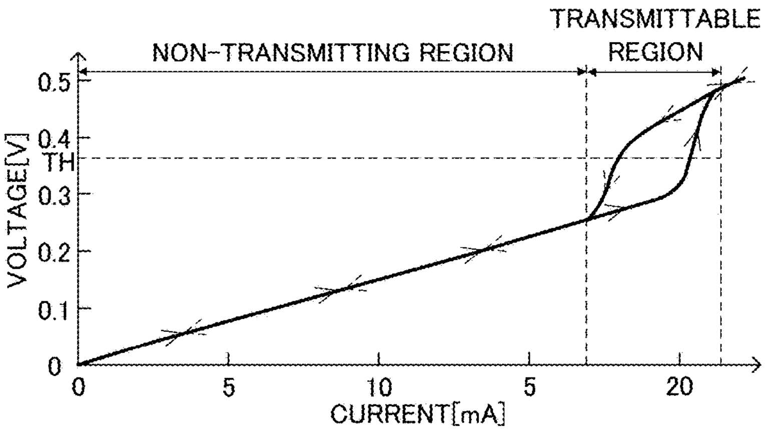
FIG. 3 is a diagram illustrating a current-voltage characteristic of a resonant tunnel diode.

However, the terahertz device has a current-voltage characteristic having two voltage values for the same current value in a transmitting region. FIG. 3 is a diagram illustrating an example of the current-voltage characteristic of the RTD as a typical example of the terahertz device.

A non-transmitting region illustrated in FIG. 3 is a region in which the RTD does not perform transmission. A transmittable region illustrated in FIG. 3 is a region in which the RTD can perform transmission. Note that the RTD does not perform transmission in a region having larger current than the transmittable region. In the transmittable region illustrated in FIG. 3, the RTD performs transmission if a voltage value of the voltage applied to the RTD is a threshold value TH or higher, while the RTD does not perform transmission if a voltage value of the voltage applied to the RTD is lower than the threshold value TH. Solid line arrows illustrated in FIG. 3 indicate a change direction of the current-voltage characteristic when the current supplied to the RTD is increased. Broken line arrows illustrated in FIG. 3 indicate the change direction of the current-voltage characteristic when the current supplied to the RTD is decreased.

Because of the current-voltage characteristic of the RTD described above, if the driving device 10 drives the RTD with a current of 18 mA, for example, a value of the voltage applied to the RTD becomes indefinite so that it is uncertain whether or not the RTD will perform transmission, unless the time history of the current is not determined.

Therefore, the driving device 10 includes a current source that generates an output current Iout for driving the terahertz device with the current drive method, and the current source has a structure for performing the following operation.

The current source increases the current value of the output current Iout from a first current value I1 in the non-transmitting region to a second current value I2 larger than the transmittable region within one nanosecond, so as to drive the terahertz device with the output current Iout of the second current value I2. In this drive, the terahertz device does not perform transmission. In addition, by increasing the current value of the output current Iout from the first current value I1 to the second current value I2 within one nanosecond, power consumption can be suppressed in the period while the current value of the output current Iout is increased from the first current value I1 to the second current value I2.

After that, the current source decreases the current value of the output current Iout from the second current value I2 to a third current value I3 in the transmittable region, so as to drive the terahertz device with the output current Iout of the third current value I3. In this drive, the terahertz device performs transmission. The third current value I3 is preferably set to a current value of the output current Iout at which the output of the terahertz device becomes maximum, for example.

After that, the current source decreases the current value of the output current Iout from the third current value I3 to the first current value I1.

The current source performs the series of operation described above in a periodical manner.

The first current value I1 may be zero or may be larger than zero. If the first current value I1 is zero, power consumption of the driving device 10 can be suppressed. On the other hand, if the first current value I1 is larger than zero, the current value of the output current Iout can be easily increased from the first current value I1 to the second current value I2 within one nanosecond.

It is preferred that the frequency of the above operation is 100 Hz or more and 10 MHz or less. By this setting of the frequency, the frequency analysis on the receiving side can be easily performed. In addition, in consideration that a decrease in the intensity of 1/f noise is saturated at approximately 1 MHz, it is more preferred that the frequency of the above operation is set to be 1 MHz or more and 10 MHz or less.

First Embodiment of Driving Device

Figure 4:
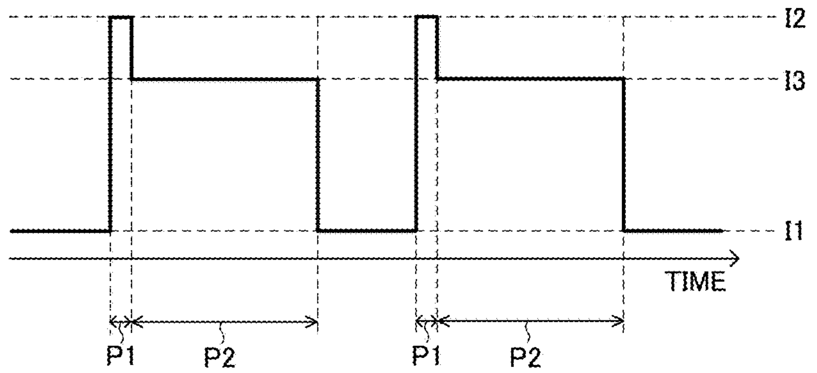
FIG. 4 is a diagram illustrating a waveform of an output current output from a driving device according to a first embodiment.

FIG. 4 is a diagram illustrating a waveform of the output current Iout output from the driving device 10 according to a first embodiment. In the first embodiment, the waveform of the output current Iout is a rectangular waveform.

It is preferred that a first period P1, during which the terahertz device is driven with the output current Iout of the second current value I2, is shorter than a second period, during which the terahertz device is driven with the output current Iout of the third current value I3. In this way, power consumption in the first period P1 during which the terahertz device does not perform transmission can be suppressed. The length of the first period P1 is preferably set to approximately 1% of the period of the output current Iout, for example.

Figure 5:
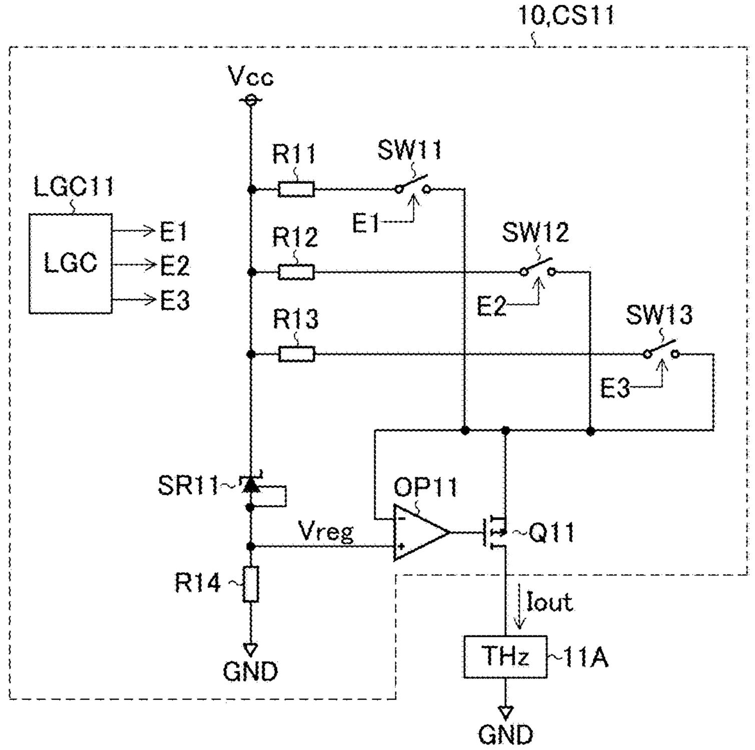
FIG. 5 is a diagram illustrating a structural example of the driving device according to the first embodiment.

FIG. 5 is a diagram illustrating a structural example of the driving device 10 according to the first embodiment. The driving device 10 of the structural example illustrated in FIG. 5 has a structure including a switch and an operational amplifier, and generates the output current Iout of the waveform illustrated in FIG. 4, so as to supply the output current Iout to a terahertz device 11A included in the transmitter 11 (see FIG. 1).

The driving device 10 having the structural example illustrated in FIG. 5 includes resisters R11 to R14, switches SW11 to SW13, a logic circuit LGC11, a shunt regulator SR11, an operational amplifier OP11, and a P-channel type metal oxide semiconductor (MOS) field effect transistor Q11.

Figure 6:
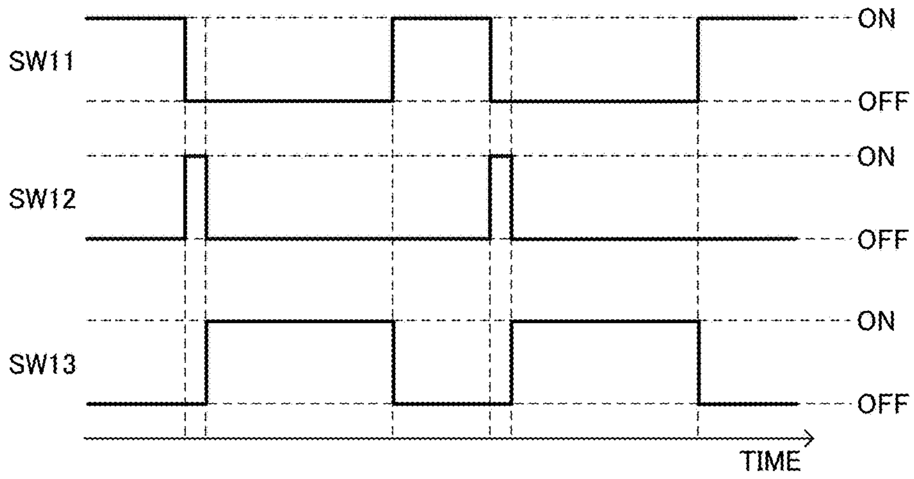
FIG. 6 is a diagram illustrating a state of a switch included in the driving device of the structural example illustrated in FIG. 5.

FIG. 6 is a diagram illustrating states of the switches SW11 to SW13 included in the driving device 10 of the structural example illustrated in FIG. 5. The states of the switches SW11 to SW13 are controlled by enable signals E1 to E3, respectively, which are output from the logic circuit LGC11.

When the switch SW11 is in ON state, the current value of the output current Iout is the first current value I1. The first current value I1 is determined depending on a voltage value of a voltage Vreg output from the shunt regulator SR11 and a resistance value of the resister R11.

When the switch SW12 is in ON state, the current value of the output current Iout is the second current value I2. The second current value I2 is determined depending on a voltage value of the voltage Vreg output from the shunt regulator SR11 and a resistance value of the resister R12.

When the switch SW13 is in ON state, the current value of the output current Iout is the third current value I3. The third current value I3 is determined depending on a voltage value of the voltage Vreg output from the shunt regulator SR11 and a resistance value of the resister R13.

The resistance value of the resister R11 is larger than the resistance value of the resister R13. The resistance value of the resister R13 is larger than the resistance value of the resister R12.

Second Embodiment of Driving Device

Figure 7:
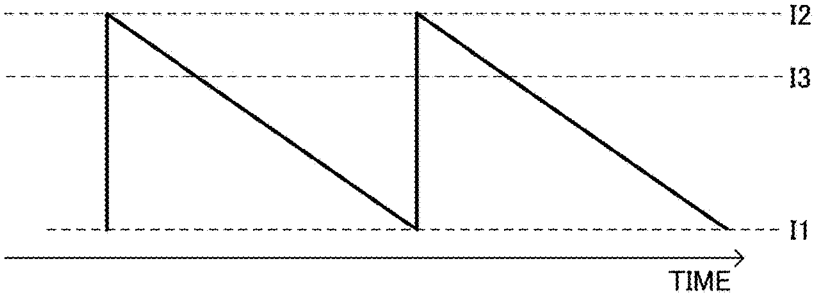
FIG. 7 is a diagram illustrating a waveform of an output current output from the driving device according to a second embodiment.

FIG. 7 is a diagram illustrating a waveform of the output current Iout output from the driving device 10 according to a second embodiment. In the second embodiment, the waveform of the output current Iout is a ramp wave having a first slope and a second slope. The first slope is a slope from the first current value I1 (a lower limit value of the ramp wave) to the second current value I2 (an upper limit value of the ramp wave) along time elapse. The second slope is a slope from the second current value I2 (the upper limit value of the ramp wave) to the first current value I1 (the lower limit value of the ramp wave) along time elapse. The first slope is larger than the absolute value of the second slope. Note that the ramp wave illustrated in FIG. 7 is a sawtooth wave, but it may be a triangular wave having the first slope smaller than that of the sawtooth wave.

Figure 8:
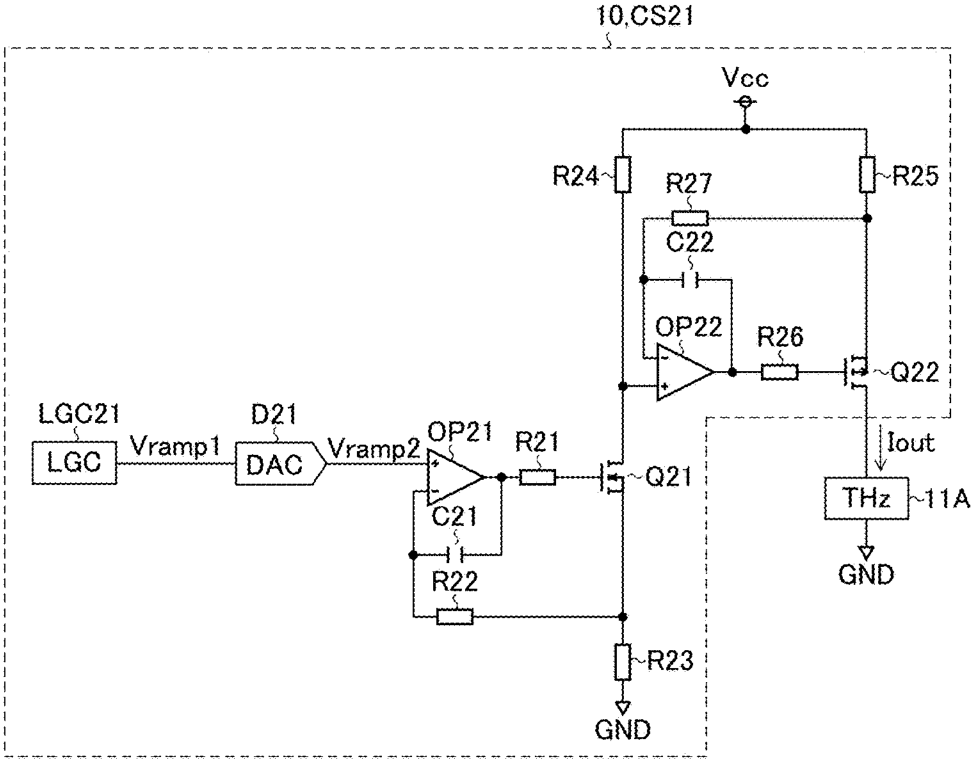
FIG. 8 is a diagram illustrating a structural example of the driving device according to the second embodiment.

FIG. 8 is a diagram illustrating a structural example of the driving device 10 according to the second embodiment. The driving device 10 of the structural example illustrated in FIG. 8 has a structure including a DA converter and an operational amplifier, and generates the output current Iout of the waveform illustrated in FIG. 7, so as to supply the output current Iout to the terahertz device 11A included in the transmitter 11 (see FIG. 1).

The driving device 10 of the structural example illustrated in FIG. 8 includes a logic circuit LGC21, a DA converter D21, operational amplifiers OP21 and OP22, resisters R21 to R27, capacitors C21 and C22, an N-channel type MOS field effect transistor Q21, and a P-channel type MOS field effect transistor Q22.

The logic circuit LGC21 supplies a digital ramp voltage Vramp1 to the DA converter D21. The DA converter D21 converts the digital ramp voltage Vramp1 to an analog ramp voltage Vramp2. The logic circuit LGC21 stores data about the digital ramp voltage Vramp1 such that the waveform of the analog ramp voltage Vramp2 and the waveform of the output current Iout are similar to each other.

The driving device 10 according to the second embodiment has an advantage that switching noise is not generated, unlike the driving device 10 according to the first embodiment.

Drive of Plurality of Terahertz Devices

In the above description, the driving device 10 included in the transmitter 11 is one terahertz device, but if a plurality of terahertz devices perform transmission, higher output of the terahertz wave can be achieved, and the S/N ratio can be improved.

Figure 9:
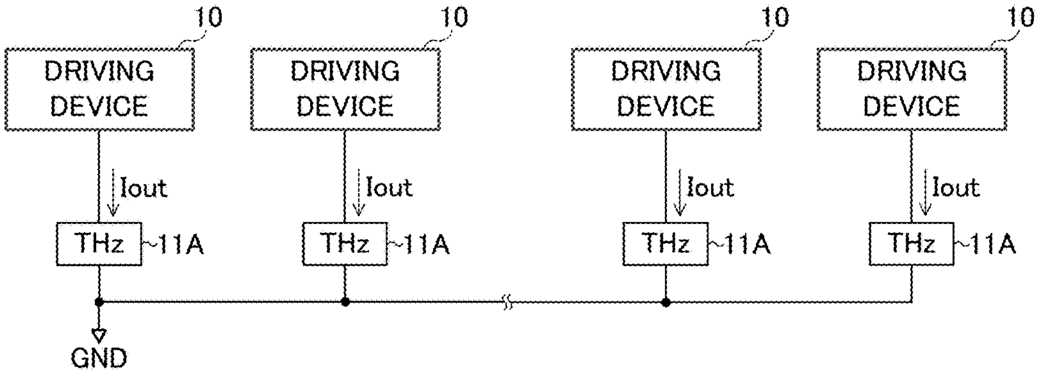
FIG. 9 is a diagram for explaining a parallel drive of a plurality of terahertz devices.
Figure 10:
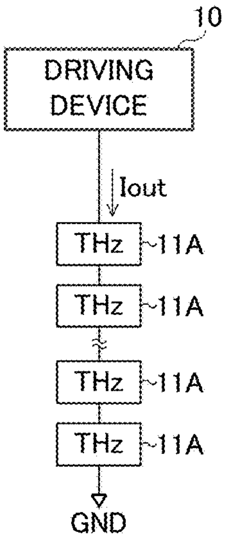
FIG. 10 is a diagram for explaining a serial drive of a plurality of terahertz devices.

As a method of driving a plurality of the terahertz devices 11A, there are a parallel drive illustrated in FIG. 9 and a serial drive illustrated in FIG. 10.

In the parallel drive illustrated in FIG. 9, the same number of the driving devices 10 as the plurality of terahertz devices 11A are necessary. On the other hand, the serial drive illustrated in FIG. 10 has an advantage that only one driving device 10 is necessary regardless of the number of the terahertz devices 11A. In the serial drive illustrated in FIG. 10, the drive voltage applied to the plurality of terahertz devices 11A is increased depending on the number of the terahertz devices 11A. However, because the forward voltage of the terahertz device 11A (e.g., approximately 0.4 V for the RTD) is small, the driving device 10 can be a device on a basis of an existing driver for a light emitting diode (LED), if the number of the terahertz devices 11A is approximately less than 10.

Others

The embodiments described above are merely examples in every aspect and should not be interpreted as limitations. The technical scope of the present disclosure is defined not by the above description of the embodiments but by the claims, and should be understood to include all modifications within meaning and scope equivalent to the claims.

For instance, the transmitting element driven by the driving device 10 may be a device other than the terahertz device, as long as it has a current-voltage characteristic having two voltage values for the same current value in the transmitting region.

Additional Remarks

Additional remarks are described below about the present disclosure that is illustrated with specific structural examples in the embodiments described above.

A driving device (10) of the present disclosure includes a current source (CS11, CS21) configured to generate an output current, in which the current source is configured to periodically perform operations comprising of: increasing a current value of the output current, from a first current value in a non-transmitting region in which a transmitting element (11A) does not perform transmission, to a second current value larger than a transmittable region in which the transmitting element is capable of performing transmission, within one nanosecond; driving the transmitting element with the output current of the second current value; decreasing the current value of the output current from the second current value to a third current value in the transmittable region; driving the transmitting element with the output current of the third current value; and decreasing the current value of the output current from the third current value to the first current value (first structure).

The driving device of the above first structure drives the terahertz device with a current drive method. In the terahertz device, a change in output of the terahertz device with respect to a change in the drive current supplied to the terahertz device is smaller than a change in output of the terahertz device with respect to a change in a drive voltage applied to the terahertz device. Therefore, the driving device of the above first structure can enhance output stability of the terahertz device with respect to a change in surrounding environment, compared with a driving device adopting a voltage drive method. In addition, the driving device of the above first structure can enhance output stability of the terahertz device with respect to a power supply error (i.e., an output error of the driving device of the above first structure or an output error of the driving device adopting the voltage drive method), compared with the driving device adopting the voltage drive method. Further, according to the driving device of the above first structure, the time history of the current is determined, and hence the voltage value applied to the terahertz device is determined, so that the terahertz device can securely perform transmission.

The driving device of the above first structure may have a structure in which a waveform of the output current is a rectangular waveform (second structure).

The driving device of the above second structure may have a structure in which a first period to drive the transmitting element with the output current of the second current value is shorter than a second period to drive the transmitting element with the output current of the third current value (third structure).

The driving device of the above first structure may have a structure in which a waveform of the output current is a ramp wave having a first slope and a second slope, the first slope is a slope from the first current value to the second current value along time elapse, the second slope is a slope from the second current value to the first current value along time elapse, and the first slope is larger than the absolute value of the second slope (fourth structure).

The driving device of any one of the above first to fourth structures may have a structure in which a frequency of the operation is 100 Hz or more and 10 MHz or less (fifth structure).

The driving device of any one of the above first to fifth structures may have a structure in which the first current value is zero (sixth structure).

The driving device of any one of the above first to fifth structures may have a structure in which the first current value is larger than zero (seventh structure).

A transmitting/receiving device (1) according to the present disclosure includes the driving device of any one of the above first to seventh structures, a transmitter (11) including the transmitting element, a receiver (12) configured to receive a transmission signal transmitted from the transmitter (eighth structure).

The transmitting/receiving device of the above eighth structure may have a structure in which the transmitter includes a plurality of the transmitting elements (ninth structure).

The transmitting/receiving device of the above eighth structure may have a structure in which the transmitter includes a plurality of the transmitting elements connected in series (tenth structure).

The transmitting/receiving device of any one of the above eighth to tenth structures may have a structure in which the transmitting element is a terahertz device configured to transmit a terahertz wave as an electromagnetic wave in a terahertz band (eleventh structure).

What is claimed is:

1. A driving device comprising a current source configured to generate an output current, wherein the current source is configured to periodically perform operations comprising of:

increasing a current value of the output current, from a first current value in a non-transmitting region in which a transmitting element does not perform transmission, to a second current value larger than a transmittable region in which the transmitting element is capable of performing transmission, within one nanosecond;

driving the transmitting element with the output current of the second current value;

decreasing the current value of the output current from the second current value to a third current value in the transmittable region;

driving the transmitting element with the output current of the third current value; and decreasing the current value of the output current from the third current value to the first current value.

2. The driving device according to claim 1, wherein a waveform of the output current is a rectangular waveform.

3. The driving device according to claim 2, wherein a first period to drive the transmitting element with the output current of the second current value is shorter than a second period to drive the transmitting element with the output current of the third current value.

4. The driving device according to claim 1, wherein a waveform of the output current is a ramp wave having a first slope and a second slope, the first slope is a slope from the first current value to the second current value along time elapse, the second slope is a slope from the second current value to the first current value along time elapse, and the first slope is larger than the absolute value of the second slope.

5. The driving device according to claim 1, wherein a frequency of the operation is 100 Hz or more and 10 MHz or less.

6. The driving device according to claim 1, wherein the first current value is zero.

7. The driving device according to claim 1, wherein the first current value is larger than zero.

8. A transmitting/receiving device comprising:

the driving device according to claim 1;

a transmitter including the transmitting element; and a receiver configured to receive a transmission signal transmitted from the transmitter.

9. The transmitting/receiving device according to claim 8, wherein the transmitter includes a plurality of the transmitting elements.

10. The transmitting/receiving device according to claim 8, wherein the transmitter includes a plurality of the transmitting elements connected in series.

11. The transmitting/receiving device according to claim 8, wherein the transmitting element is a terahertz device configured to transmit a terahertz wave as an electromagnetic wave in a terahertz band.

* * * * *